(12) United States Patent
Lee et al.

(10) Patent No.: US 12,181,516 B2
(45) Date of Patent: Dec. 31, 2024

(54) LEAD GUIDES HAVING A RECESSED FACE

(71) Applicant: TEXAS INSTRUMENTS INCORPORATED, Dallas, TX (US)

(72) Inventors: Chi-Tsung Lee, New Taipei (TW); Ching-Han Chang, Taichung (TW); Chun-Hsien Lu, New Taipei (TW)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 1511 days.

(21) Appl. No.: 15/878,490

(22) Filed: Jan. 24, 2018

(65) Prior Publication Data

US 2019/0204380 A1   Jul. 4, 2019

Related U.S. Application Data

(60) Provisional application No. 62/612,277, filed on Dec. 29, 2017.

(51) Int. Cl.
*G01R 31/28* (2006.01)
*G01R 1/073* (2006.01)
*G01R 27/14* (2006.01)

(52) U.S. Cl.
CPC ..... *G01R 31/2889* (2013.01); *G01R 1/07314* (2013.01); *G01R 27/14* (2013.01); *G01R 31/2834* (2013.01); *G01R 31/2893* (2013.01)

(58) Field of Classification Search
CPC ............ G01R 31/2889; G01R 1/07314; G01R 31/2834; G01R 31/2893; G01R 31/2886; G01R 31/2851; G01R 31/2896; G01R 31/2884; G01R 31/28; G01R 27/14; G01R 1/07307; G01R 1/073
USPC ................................................... 324/750.24
See application file for complete search history.

(56) References Cited

U.S. PATENT DOCUMENTS

| | | | | |
|---|---|---|---|---|
| 4,045,737 A | * | 8/1977 | Coberly | G01R 1/067 324/756.03 |
| 4,410,227 A | * | 10/1983 | Prunella | G01R 31/2886 209/573 |
| 5,323,106 A | * | 6/1994 | Saegusa | G01R 1/07364 324/750.22 |
| 6,911,834 B2 | * | 6/2005 | Mitchell | G01R 1/07314 324/756.03 |
| 2004/0201390 A1 | * | 10/2004 | Farnworth | G01R 1/0466 324/754.08 |
| 2007/0279078 A1 | * | 12/2007 | Iwami | G01R 31/2891 324/754.05 |
| 2013/0063172 A1 | * | 3/2013 | Hsu | G01R 1/07314 324/754.09 |
| 2018/0059172 A1 | * | 3/2018 | Pounds | G01R 19/16538 |

* cited by examiner

*Primary Examiner* — Eman A Alkafawi
*Assistant Examiner* — Courtney G McDonnough
(74) *Attorney, Agent, or Firm* — Ronald O. Neerings; Frank D. Cimino (57) ABSTRACT

An embodiment includes a first lead guide, a second lead guide, and a handler. The first lead guide includes a first insulating housing and a first conductive contact having a face and a recessed face. The second lead guide includes a second insulating housing and a second conductive contact. The first and second lead guides are fastened to the handler.

26 Claims, 6 Drawing Sheets

LEAD GUIDES HAVING A RECESSED FACE

CROSS-REFERENCE TO RELATED APPLICATIONS

The present application claims priority to U.S. Provisional Patent Application No. 62/612,277, which was filed Dec. 29, 2017, is titled "Lead Guides Having A Recessed Face," and is hereby incorporated herein by reference in its entirety.

BACKGROUND

Four-terminal sensing, also referred to as Kelvin sensing, can be useful when testing integrated circuits with small resistances. In Kelvin sensing, a first pair of contacts is placed in electrical contact with a first lead of the integrated circuit, and a second pair of contacts is placed in electrical contact with a second lead of the integrated circuit. Each pair of contacts comprises a force contact and a sense contact. To measure the resistance presented by the first and second leads, a test system drives (sources or sinks) current through the force contacts, and the test system senses current flowing through the sense contacts in response to the drive (or force) current.

SUMMARY

In accordance with a first set of embodiments, a system comprises: a first lead guide; a second lead guide; and a handler. The first lead guide comprises: a first insulating housing having a face and a recessed face, the first lead guide including a first conductive contact having a face and a recessed face, wherein the face of the first conductive contact is parallel to the face of the first insulating housing, and the recessed face of the first conductive contact is parallel to the recessed face of the first insulating housing. The second lead guide comprises: a second insulating housing having a face and a recessed face, the second lead guide including a second conductive contact having a face and a recessed face, wherein the face of the second conductive contact is parallel to the face of the second insulating housing, and the recessed face of the second conductive contact is parallel to the recessed face of the second insulating housing. The first and second lead guides are fastened to the handler.

In accordance with the first set of embodiments, in the system, the face of the first contact is flush with the face of the first insulating housing, the recessed face of the first contact is flush with the recessed face of the first insulating housing, the face of the second contact is flush with the recessed face of the second insulating housing, and the recessed face of the second contact is flush with the recessed face of the second insulating housing.

In accordance with the first set of embodiments, the system further comprises a contactor. The contactor comprises: a first set of force pins to contact the face of the first conductive contact; and a second set of force pins to contact the face of the second conductive contact.

In accordance with the first set of embodiments, in the system, the first set of force pins comprises three force pins, and the second set of force pins comprises three force pins.

In accordance with the first set of embodiments, in the system, the contactor further comprises: a first set of sense pins; and a second set of sense pins.

In accordance with the first set of embodiments, in the system, the first set of sense pins comprises two sense pins, and the second set of sense pins comprises two sense pins.

In accordance with the first set of embodiments, the system further comprises: a device-under-test (DUT) having a first lead and a second lead, wherein the handler holds the DUT so that the first lead is in contact with the recessed face of the first conductive contact, and the second lead is in contact with the recessed face of the second conductive contact.

In accordance with the first set of embodiments, in the system, the first set of sense pins is in contact with the first lead, and the second set of sense pins is in contact with the second lead.

In accordance with the first set of embodiments, in the system, the first lead is a first gull wing lead, and the second lead is a second gull wing lead.

In accordance with the first set of embodiments, in the system, the DUT comprises: a small outline package; and an integrated circuit in the small outline package.

In accordance with the first set of embodiments, the system further comprises: an automatic test equipment (ATE) electrically coupled to the first and second sets of sense pins and to the first and second sets of force pins, the ATE to source and sink current to the first and second sets of force pins and to sense current in the first and second sets of sense pins.

In accordance with a second set of embodiments, a method comprises: placing, with a handler, a device-under-test (DUT) in contact with a first lead guide and a second lead guide, the first lead guide including a first conductive contact having a face and a recessed face, the second lead guide including a second conductive contact having a face and a recessed face, and the DUT having a first lead and a second lead, wherein placing the DUT in contact with the first and second lead guides comprises placing the first lead in contact with the recessed face of the first conductive contact and placing the second lead in contact with the recessed face of the second conductive contact.

In accordance with the second set of embodiments, the method further comprises: contacting a first set of force pins with the face of the first conductive contact; contacting a first set of sense pins with the first lead; contacting a second set of force pins with the face of the second conductive contact; and contacting a second set of sense pins with the second lead.

In accordance with the second set of embodiments, the method further comprises: testing the DUT with an automatic-test-equipment (ATE), the testing including operating the first set of force pins and the first set of sense pins as a first Kelvin contact, and operating the second set of force pins and the second set of sense pins as a second Kelvin contact.

In accordance with the second set of embodiments, in the method, the first set of sense pins comprises two sense pins, the second set of sense pins comprises two sense pins, the first set of force pins comprises three force pins, and the second set of force pins comprises three force pins.

In accordance with a third set of embodiments, a system comprises: a device-under-test (DUT) comprising a first lead and a second lead; a first lead guide comprising a first conductive contact having a face and a recessed face, wherein the first lead is in contact with the recessed face of the first conductive contact; and a second lead guide comprising a second conductive contact having a face and a recessed face, wherein the second lead is in contact with the recessed face of the second conductive contact.

In accordance with the third set of embodiments, the system further comprises: a load-board; a first set of force pins in contact with the face of the first conductive contact to electrically couple the load-board to the first lead of the DUT; a first set of sense pins in contact with the first lead and electrically coupled to the load-board; a second set of force pins in contact with the face of the second conductive contact to electrically couple the load-board to the second lead of the DUT; and a second set of sense pins in contact with the second lead and electrically coupled to the load-board.

In accordance with the third set of embodiments, the system further comprises: an automatic test equipment (ATE) electrically coupled to the first and second sets of sense pins and to the first and second sets of force pins, the ATE to drive current through the first and second sets of force pins and to sense current in the first and second sets of sense pins in response to driving the current through the first and second sets of force pins.

In accordance with a fourth set of embodiments, a system comprises: a first lead guide comprising a first insulating housing, the first insulating housing comprising a first conductive contact; a second lead guide comprising a second insulating housing, the second insulating housing comprising a second conductive contact; and a contactor comprising a first set of force pins to contact the first conductive contact, and a second set of force pins to contact the second conductive contact, wherein the first set of force pins comprises two force pins, and the second set of force pins comprises two force pins.

In accordance with the fourth set of embodiments, in the system, the first set of force pins comprises three force pins, and the second set of force pins comprises three force pins.

In accordance with the fourth set of embodiments, in the system, the contactor further comprises: a first set of sense pins; and a second set of sense pins.

In accordance with the fourth set of embodiments, in the system, the first set of sense pins comprises two sense pins, and the second set of sense pins comprises two sense pins.

In accordance with the fourth set of embodiments, the system further comprises a handler, wherein the first and second lead guides are fastened to the handler.

In accordance with the fourth set of embodiments, the system further comprises: a device-under-test (DUT) having a first lead and a second lead, wherein the handler holds the DUT so that the first lead is in contact with the first conductive contact, and the second lead is in contact with the second conductive contact.

In accordance with the fourth set of embodiments, in the system, the first set of sense pins is in contact with the first lead, and the second set of sense pins is in contact with the second lead.

In accordance with a fifth set of embodiments, a method comprises: placing, with a handler, a device-under-test (DUT) in contact with a first lead guide and a second lead guide, the first lead guide comprising a first conductive contact, the second lead guide comprising a second conductive contact, and the DUT comprising a first lead and a second lead, wherein placing the DUT in contact with the first and second lead guides comprises placing the first lead in contact with the first conductive contact and placing the second lead in contact with the second conductive contact; contacting a first set of force pins with the first conductive contact, the first set of force pins comprising two force pins; contacting a first set of sense pins with the first lead; contacting a second set of force pins with the second conductive contact, the second set of force pins comprising two force pins; and contacting a second set of sense pins with the second lead.

In accordance with the fifth set of embodiments, the method further comprises: testing the DUT with an automatic-test-equipment (ATE), the testing including operating the first set of force pins and the first set of sense pins as a first Kelvin contact, and operating the second set of force pins and the second set of sense pins as a second Kelvin contact.

In accordance with the fifth set of embodiments, in the method, the first set of sense pins comprises two sense pins, and the second set of sense pins comprises two sense pins.

In accordance with the fifth set of embodiments, in the method, the first set of force pins comprises three force pins, and the second set of force pins comprises two force pins.

BRIEF DESCRIPTION OF THE DRAWINGS

For a detailed description of various examples, reference will now be made to the accompanying drawings in which.

DETAILED DESCRIPTION

Figure 5:
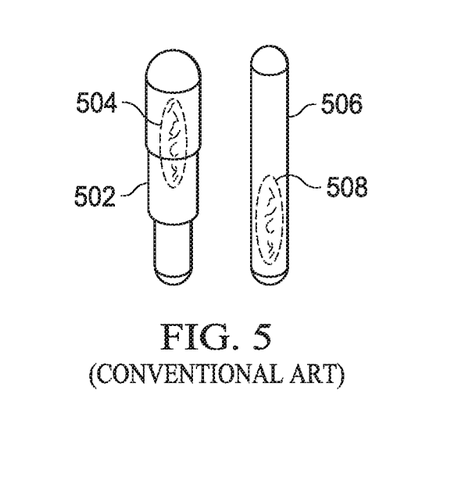
FIG. 5 shows a pogo pin with heat damage due to excessive current, in accordance with conventional art.

In automated test systems for testing a packaged integrated circuit, a handler places the packaged integrated circuit in electrical contact with various pins held in a contactor, with the pins providing electrical coupling to automatic test equipment (ATE). When testing, the integrated circuit may draw several amperes of current, where for example a lead may draw up to 4.9 amperes. This amount of current can cause heat damage to conventional contactor pins. FIG. 5 illustrates heat damage to a pogo pin due to excessive current, where a pogo pin 502 is shown with a damaged area 504 on its outside, and an internal pogo pin spring 506 is shown with a damaged area 508. In accordance with the disclosed embodiments, a system comprises a lead guide structure so that a Kelvin contact can include multiple force pins and sense pins in the contactor. The multiple force pins and sense pins can, in combination, safely carry a relatively large current, without incurring heat damage.

Figure 1:
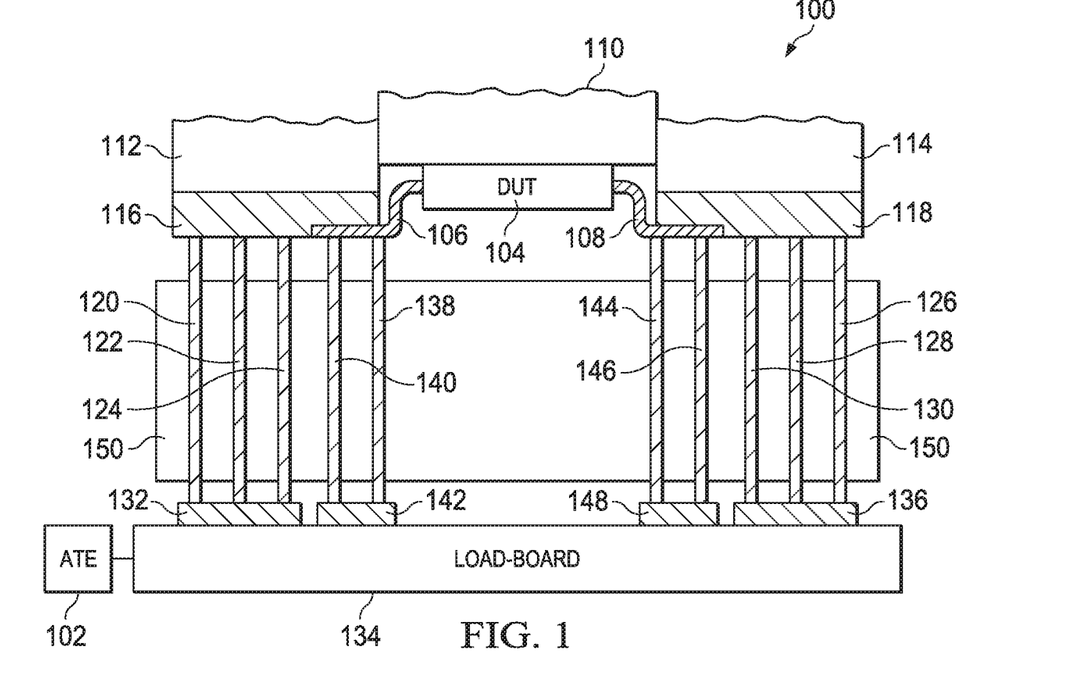
FIG. 1 shows a test system in accordance with various examples.

FIG. 1 shows an illustrative test system 100. The components illustrated in FIG. 1 are not drawn to scale. Various features are shown that may be partially hidden from view in an actual embodiment. The illustrative test system 100 electrically couples an ATE 102 to a device-under-test (DUT) 104, where the DUT 104 is a packaged integrated circuit with gull wing leads. As examples of gull wing leads, FIG. 1 shows a lead 106 and a lead 108.

A handler 110 holds and places the DUT 104 so that the lead 106 is in contact with a lead guide 112, and the lead 108 is in contact with a lead guide 114. (FIG. 1 shows the lead 106 in contact with a conductive contact 116. Because the conductive contact 116 may be viewed as being part of the lead guide 112, the lead 106 may be described as being in contact with the lead guide 112. Similar remarks apply to the lead 108 and a conductive contact 118 within the lead guide 114.) FIG. 1 illustrates only portions of the handler 110 and the lead guides 112 and 114. The lead guides 112 and 114 may be fastened to the handler 110 with fasteners (not shown), or may be integrated with the handler 110.

The lead guide 112 includes the conductive contact 116, and the lead guide 114 includes the conductive contact 118. With respect to the view provided by FIG. 1, the conductive contacts 116 and 118 would be hidden from view in an actual embodiment, but they are shown to illustrate their role in electrically coupling the DUT 104 to the ATE 102.

The handler 110 places the DUT 104 in contact with the lead guides 112 and 114 so that the lead 106 is in contact with the conductive contact 116, and the lead 108 is in contact with the conductive contact 118. A set of force pins 120, 122, and 124 is in contact with the conductive contact 116, and a set of force pins 126, 128, and 130 is in contact with the conductive contact 118. In the particular embodiment of FIG. 1, each set of force pins has three force pins. Other embodiments may have fewer or more force pins in any particular set of force pins.

With the lead 106 in contact with the conductive contact 116, the set of force pins 120, 122, and 124 is electrically coupled to the lead 106. The set of force pins 120, 122, and 124 is in contact with a contact 132 on a load-board 134, and the ATE 102 is electrically coupled to the load-board. In this way, the ATE 102 is electrically coupled to the lead 106 so that the ATE 102 can drive (source or sink) current through the set of force pins 120, 122, and 124 and to the lead 106.

With the lead 108 in contact with the conductive contact 118, the set of force pins 126, 128, and 130 is electrically coupled to the lead 108. The set of force pins 126, 128, and 130 is in contact with a contact 136 on the load-board 134. In this way, the ATE 102 is electrically coupled to the lead 108 so that the ATE 102 can drive (source or sink) current through the set of force pins 126, 128, and 130 and to the lead 108.

A set of sense pins 138 and 140 is in contact with the lead 106, and in contact with a contact 142 on the load-board 134. A set of sense pins 144 and 146 is in contact with the lead 108, and in contact with a contact 148 on the load-board 134. In this way, the ATE 102 is electrically coupled to the leads 106 and 108 to sense current in response to current driven through the set of force pins 120, 122, and 124 and the set of force pins 126, 128, and 130. In the particular embodiment of FIG. 1, each set of sense pins has two sense pins. Other embodiments may have fewer or more sense pins in any particular set of sense pins.

A contactor 150 holds the sets of force pins and the sets of sense pins. In an actual embodiment, the sets of force pins and the sets of sense pins are not visible through the contactor 150. The pins may be pogo pins, where a pogo pin comprises one or more members that can move relative to each other under the compression of a spring so as to facilitate electrical contact with leads on the DUT 104 and contacts on the load-board 134.

Figure 6:
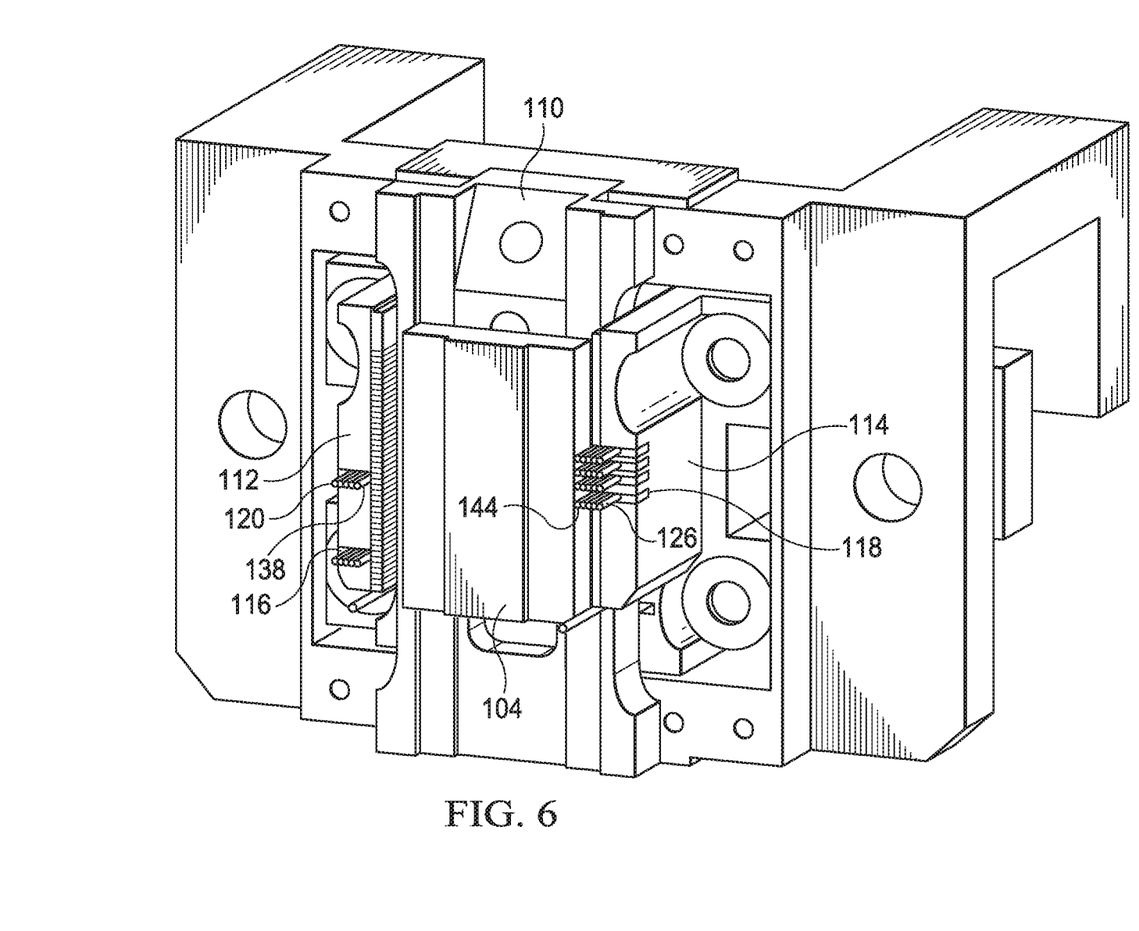
FIG. 6 shows a test system in accordance with various examples.

FIG. 6 shows the handler 110, the lead guides 112 and 114, and the DUT 104 of FIG. 1, with a perspective view showing more detail. Referring to FIG. 6, several conductive contacts are shown, for example the conductive contacts 116 and 118. Several sets of force pins are shown, for example the force pins 120 and 126; and several sets of sense pins are shown, for example the sense pins 138 and 144. FIG. 6 does not show all of the force and sense pins, nor does FIG. 6 show the entire length of the source and sense pins.

FIG. 1 illustrates two sets of force pins and two sets of sense pins. The combination of the set of force pins 120, 122, and 124, and the set of sense pins 138 and 140, provides a Kelvin contact electrically coupled to the lead 106. The combination of the set of force pins 126, 128, and 130, and the set of sense pins 144 and 146, provides a Kelvin contact electrically coupled to the lead 108.

The contactor 150 can include more than two sets of force pins and two sets of sense pins, where each lead of the DUT 104 is electrically connected to a Kelvin contact comprising a set of force pins and a set of sense pins.

Figure 7A:
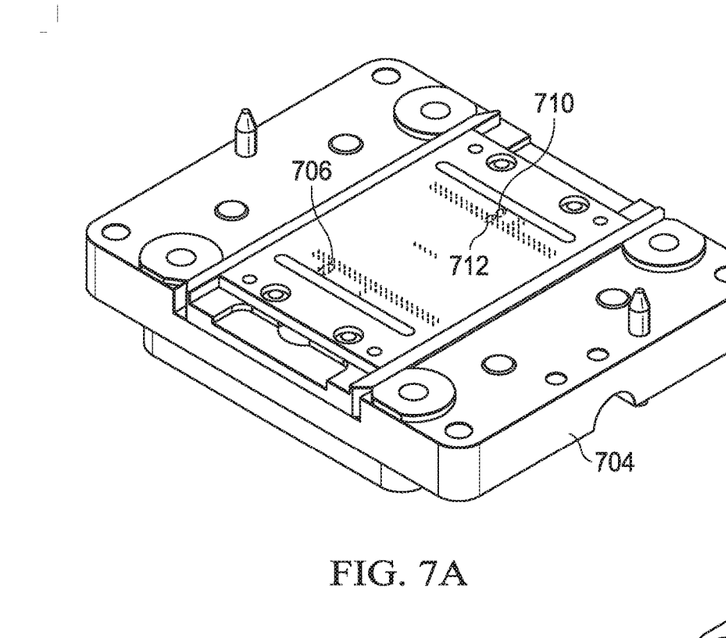
FIG. 7A shows a bottom perspective view of a contactor in accordance with various examples.
Figure 7B:
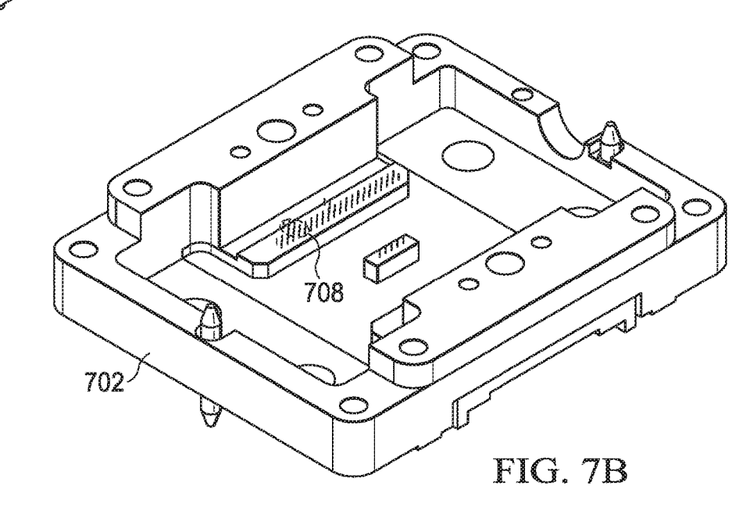
FIG. 7B shows a top perspective view of a contactor in accordance with various examples.

FIG. 7A shows a bottom perspective view of the contactor 150, labeled 704. FIG. 7B shows a top perspective view of the contactor 150, labeled 702. The label 706 shows a bottom view of two sets of force pins, and the label 708 shows a top view of the same two sets of force pins indicated by the label 706. The label 710 shows a bottom view of a set of force pins. Some of the pins shown in FIG. 7A and in FIG. 7B can be identified as sense pins with associated force pins. For example, the label 712 shows a bottom view of a set of sense pins associated with the set of force pins 710, where the sets of pins 710 and 712 together, in combination, provide a Kelvin contact.

Figure 2:
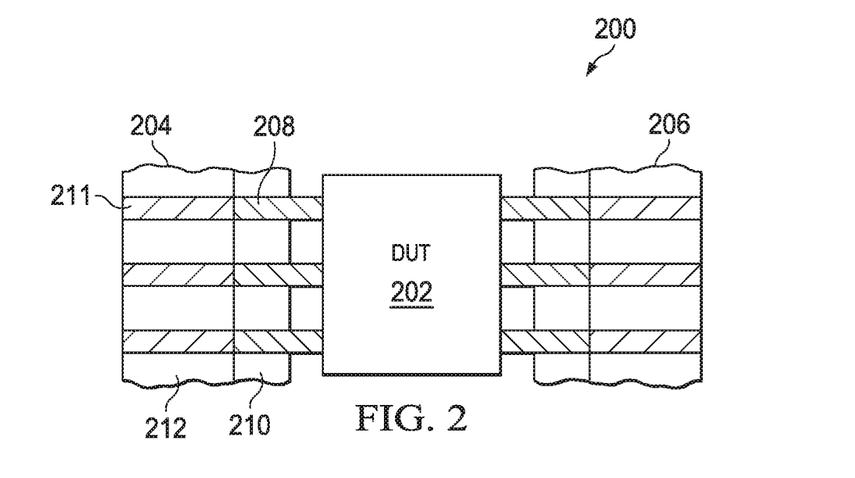
FIG. 2 shows a test system in accordance with various examples.

FIG. 2 shows an illustrative test system 200 providing a plan view of the underside of a DUT 202. In the particular embodiment of FIG. 2, the DUT 202 comprises six leads, although a DUT can have more or less than six leads. For ease of illustration, FIG. 2 does not show the handler 110, the load-board 134, and the ATE 102 of FIG. 1. FIG. 2 provides a simplified plan view, although the various components are not drawn to scale.

The DUT 202 is placed in contact with a lead guide 204 and a lead guide 206. The leads of the DUT 202 are in contact with metal contacts in the lead guides. The shape of a lead guide includes a recessed face for receiving a lead. For example, a lead 208 is in contact with a recessed face 210 of the lead guide 204. The lead guide 204 includes a conductive contact 211. Although not shown in FIG. 2, part of the conductive contact 211 is (relative to the plan view provided by FIG. 2) underneath the lead 208, so that the lead 208 is in contact with and electrically coupled to the conductive contact 211. The recessed face 210 is recessed relative to a face 212 of the lead guide 204. Relative to the plan view provided by FIG. 2, the recessed face 210 lies in a plane below that of the face 212.

Figure 3:
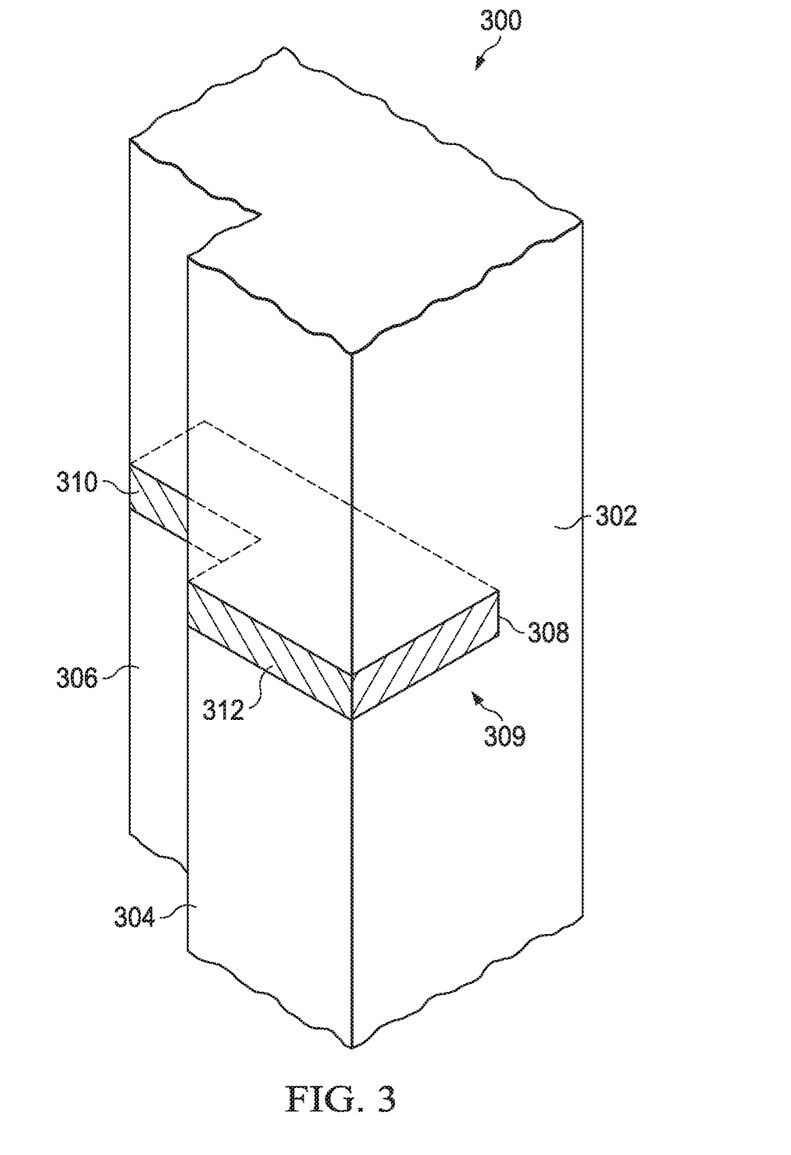
FIG. 3 shows a lead guide in accordance with various examples.

FIG. 3 shows an illustrative lead guide 300. FIG. 3 provides a simplified perspective view of the lead guide 300, not necessarily drawn to scale. An insulating housing 302 has a face 304 and a recessed face 306. The insulating housing 302 includes a conductive contact 308. For some embodiments, a slot 309 is formed within the insulating housing 302 for receiving the conductive contact 308, where the conductive contact 308 is inserted into the slot 309. For some embodiments, the conductive contact 308 is glued into the slot 309. For some embodiments, the conductive contact 308 may be formed in the insulating housing 302 during its manufacture.

The face 304 and the recessed face 306 of the insulating housing 302 may also be considered as features of the illustrative lead guide 300. That is, the face 304 of the insulating housing 302 may also be referred to as a face 304 of the illustrative lead guide 300, and the recessed face 306 of the insulating housing 302 may also be referred to as a recessed face 306 of the illustrative lead guide 300.

The conductive contact 308 has a recessed face 310 and a face 312. The recessed face 310 of the conductive contact 308 is parallel to the recessed face 306 of the insulating housing 302, and the face 312 of the conductive contact 308 is parallel to the face 304 of the insulating housing 302. For some embodiments, the conductive contact 308 is sized and positioned within the slot 309 so that the recessed face 310 of the conductive contact 308 is flush with the recessed face 306 of the insulating housing 302, and the face 312 of the conductive contact 308 is flush with the face 304 of the insulating housing 302.

In some embodiments, the recessed face 306 of the insulating housing 302, and the recessed face 310 of the conductive contact 308, are each at a depth (with respect to the faces 304 and 312) equal to the thickness of the leads 106 and 108 of the DUT 104 of FIG. 1. In this way, with the leads 106 and 108 in contact with the recessed faces of the conductive contacts 116 and 118, the sense and force pins extend to the same length.

Although not shown in FIG. 3, a handler holds and places a DUT such that a lead of the DUT is in contact with the recessed face 310 of the conductive contact 308. A set of sense pins is put in contact with the lead (shown in FIG. 1), and a set of force pins is put in contact with the face 312 of the conductive contact 308, where the sets of force pins and sense pins in combination constitute a Kelvin contact (or pin or probe).

For ease of illustration, FIG. 3 shows the illustrative lead guide 300 as having only one conductive contact (i.e., the conductive contact 308), but in practice an embodiment includes more than one conductive contact.

Figure 8:
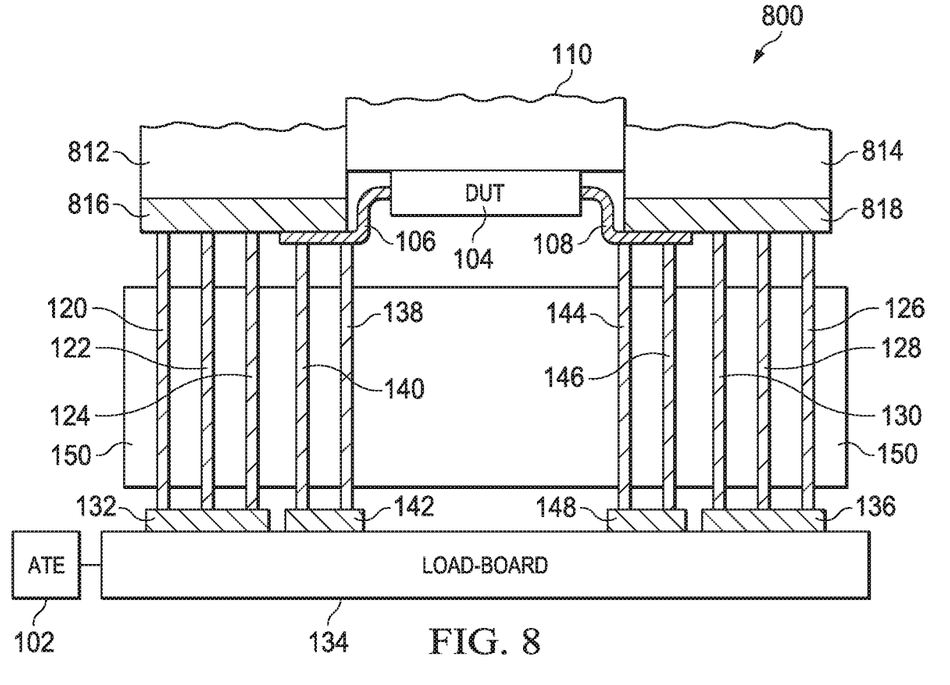
FIG. 8 shows a test system in accordance with various examples.

FIG. 8 shows an illustrative test system 800 where a lead guide 814 and a lead guide 812 do not have recessed faces. Accordingly, a conductive contact 818 and a conductive contact 816 do not have recessed faces. Other than lead guides and conductive contacts not having recessed faces, the embodiment of FIG. 8 is similar to that of FIG. 1, with similar components sharing the same numeric labels.

Figure 4:
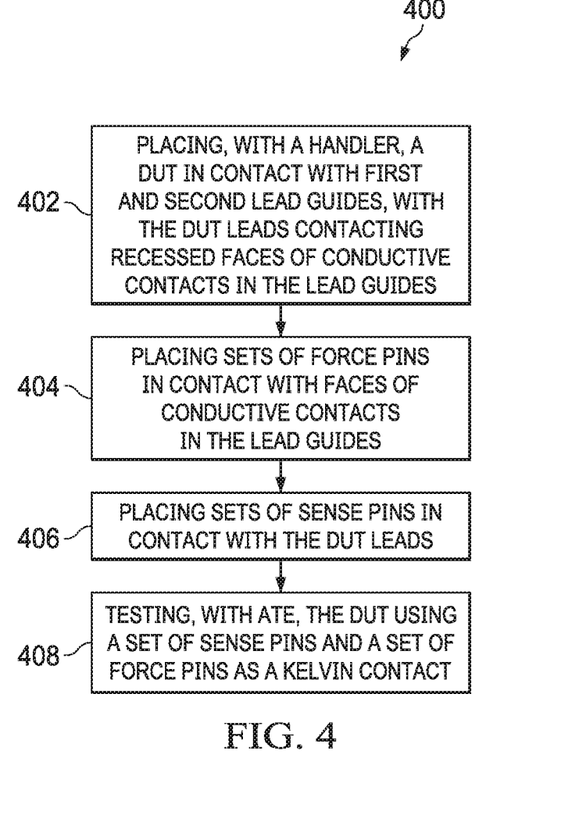
FIG. 4 shows a method for testing a device-under-test as part of a fabrication process.

FIG. 4 shows an illustrative method 400 for testing a DUT, where the illustrative method 400 is part of a fabrication process to fabricate the DUT. In step 402, a handler (e.g., the handler 110 of FIG. 1) is used to place a DUT (e.g., the DUT 104) in contact with a first lead guide and a second lead guide. The first and second lead guides may each be, for example, the illustrative lead guide 300 of FIG. 3, where each lead guide includes (at least one) conductive contact having a face and a recessed face. When placing a DUT in contact with the lead guides, the leads of the DUT are placed in contact with the recessed faces of the conductive contacts.

In step 404, sets of force pins are placed in contact with the faces of the conductive contacts, and in step 406 sets of sense pins are placed in contact with the DUT leads. In step 408, an ATE is used to test the DUT, where the test includes operating a set of sense pins and a set of force pins as a Kelvin contact.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A system comprising:
a first lead guide, wherein the first lead guide comprises:
a first insulating housing having a face and a recessed face, the first insulating housing including a first conductive contact having a face and a recessed face, wherein the face of the first conductive contact is parallel to the face of the first insulating housing, and the recessed face of the first conductive contact is parallel to the recessed face of the first insulating housing;
a second lead guide, wherein the second lead guide comprises:
a second insulating housing having a face and a recessed face, the second insulating housing including a second conductive contact having a face and a recessed face, wherein the face of the second conductive contact is parallel to the face of the second insulating housing, and the recessed face of the second conductive contact is parallel to the recessed face of the second insulating housing; and
a handler, wherein the first and second lead guides are fastened to the handler; and
a contactor, wherein the contactor comprises:
a first set of force pins to contact the face of the first conductive contact, and
a second set of force pins to contact the face of the second conductive contact.

2. The system of claim 1, wherein
the first set of force pins comprises three force pins, and
the second set of force pins comprises three force pins.

3. The system of claim 1, the contactor further comprising:
a first set of sense pins; and
a second set of sense pins.

4. The system of claim 3, wherein
the first set of sense pins comprises two sense pins, and
the second set of sense pins comprises two sense pins.

5. The system of claim 3, further comprising:
a device-under-test (DUT) having a first lead and a second lead,
wherein the handler holds the DUT so that the first lead is in contact with the recessed face of the first conductive contact, and the second lead is in contact with the recessed face of the second conductive contact.

6. The system of claim 5, wherein
the first set of sense pins is in contact with the first lead, and
the second set of sense pins is in contact with the second lead.

7. The system of claim 6, wherein
the first set of sense pins comprises two sense pins, and
the second set of sense pins comprises two sense pins.

8. The system of claim 7, wherein
the first set of force pins comprises three force pins, and
the second set of force pins comprises three force pins.

9. The system of claim 7, wherein
the first lead is a first gull wing lead, and
the second lead is a second gull wing lead.

10. The system of claim 7, wherein the DUT comprises:
a small outline package; and
an integrated circuit in the small outline package.

11. The system of claim 7, further comprising:
an automatic test equipment (ATE) electrically coupled to the first and second sets of sense pins and to the first and second sets of force pins, the ATE to source and sink current to the first and second sets of force pins and to sense current in the first and second sets of sense pins.

12. A method comprising:
placing, with a handler, a device-under-test (DUT) in contact with a first lead guide and a second lead guide, the first lead guide including a first conductive contact having a face and a recessed face, the second lead guide including a second conductive contact having a face and a recessed face, and the DUT having a first lead and a second lead, wherein placing the DUT in contact with the first and second lead guides comprises placing the first lead in contact with the recessed face of the first conductive contact and placing the second lead in contact with the recessed face of the second conductive contact;

contacting a first set of force pins with the face of the first conductive contact;

contacting a first set of sense pins with the first lead;

contacting a second set of force pins with the face of the second conductive contact; and contacting a second set of sense pins with the second lead.

13. The method of claim 12, further comprising:
testing the DUT with an automatic-test-equipment (ATE), the testing including operating the first set of force pins and the first set of sense pins as a first Kelvin contact, and operating the second set of force pins and the second set of sense pins as a second Kelvin contact.

14. The method of claim 12, wherein
the first set of sense pins comprises two sense pins,
the second set of sense pins comprises two sense pins,
the first set of force pins comprises three force pins, and
the second set of force pins comprises three force pins.

15. A system comprising:
a device-under-test (DUT) comprising a first lead and a second lead;
a first lead guide comprising a first conductive contact having a face and a recessed face, wherein the first lead is in contact with the recessed face of the first conductive contact;
a second lead guide comprising a second conductive contact having a face and a recessed face, wherein the second lead is in contact with the recessed face of the second conductive contact;
a load-board;
a first set of force pins in contact with the face of the first conductive contact to electrically couple the load-board to the first lead of the DUT;
a first set of sense pins in contact with the first lead and electrically coupled to the load-board;
a second set of force pins in contact with the face of the second conductive contact to electrically couple the load-board to the second lead of the DUT; and
a second set of sense pins in contact with the second lead and electrically coupled to the load-board.

16. The system of claim 15, further comprising:
an automatic test equipment (ATE) electrically coupled to the first and second sets of sense pins and to the first and second sets of force pins, the ATE to drive current through the first and second sets of force pins and to sense current in the first and second sets of sense pins in response to driving the current through the first and second sets of force pins.

17. A system comprising:
a first lead guide comprising a first insulating housing, the first insulating housing comprising a first conductive contact;
a second lead guide comprising a second insulating housing, the second insulating housing comprising a second conductive contact; and
a contactor comprising a first set of force pins to contact the first conductive contact, and a second set of force pins to contact the second conductive contact, wherein the first set of force pins comprises at least three force pins, and the second set of force pins comprises at least three force pins.

18. The system of claim 17, the contactor further comprising:
a first set of sense pins; and
a second set of sense pins.

19. The system of claim 18, wherein
the first set of sense pins comprises two sense pins, and
the second set of sense pins comprises two sense pins.

20. The system of claim 18, further comprising a handler, wherein the first and second lead guides are fastened to the handler.

21. The system of claim 20, further comprising:
a device-under-test (DUT) having a first lead and a second lead,
wherein the handler holds the DUT so that the first lead is in contact with the first conductive contact, and the second lead is in contact with the second conductive contact.

22. The system of claim 21, wherein
the first set of sense pins is in contact with the first lead, and
the second set of sense pins is in contact with the second lead.

23. A method comprising:
placing, with a handler, a device-under-test (DUT) in contact with a first lead guide and a second lead guide, the first lead guide comprising a first conductive contact, the second lead guide comprising a second conductive contact, and the DUT comprising a first lead and a second lead, wherein placing the DUT in contact with the first and second lead guides comprises placing the first lead in contact with the first conductive contact and placing the second lead in contact with the second conductive contact;
contacting a first set of force pins with the first conductive contact, the first set of force pins comprising two force pins;
contacting a first set of sense pins with the first lead;
contacting a second set of force pins with the second conductive contact, the second set of force pins comprising two force pins; and
contacting a second set of sense pins with the second lead.

24. The method of claim 23, further comprising:
testing the DUT with an automatic-test-equipment (ATE), the testing including operating the first set of force pins and the first set of sense pins as a first Kelvin contact, and operating the second set of force pins and the second set of sense pins as a second Kelvin contact.

25. The method of claim 23, wherein
the first set of sense pins comprises two sense pins, and
the second set of sense pins comprises two sense pins.

26. The method of claim 23, wherein
the first set of force pins comprises three force pins, and
the second set of force pins comprises two force pins.

\* \* \* \* \*